United States Patent
Diehl et al.

(10) Patent No.: US 7,847,550 B2
(45) Date of Patent: Dec. 7, 2010

(54) CONTROL METHOD FOR SAR-OPTIMIZED ACTIVATION OF A COIL ARRAY

(75) Inventors: Dirk Diehl, Erlangen (DE); Juergen Nistler, Erlangen (DE); Wolfgang Renz, Erlangen (DE); Markus Vester, Nuernberg (DE); Sebastian Wolf, Adelsdorf (DE)

(73) Assignee: Siemens Aktiengesellschaft, Munich (DE)

(\*) Notice: Subject to any disclaimer, the term of this patent is extended or adjusted under 35 U.S.C. 154(b) by 95 days.

(21) Appl. No.: 12/353,292

(22) Filed: Jan. 14, 2009

(65) Prior Publication Data

US 2009/0179645 A1     Jul. 16, 2009

(30) Foreign Application Priority Data

Jan. 14, 2008   (DE) .................... 10 2008 004 256

(51) Int. Cl.
*G01V 3/00* (2006.01)
(52) U.S. Cl. ..................... 324/309; 324/307
(58) Field of Classification Search ......... 324/300–322; 600/407–445
See application file for complete search history.

(56) References Cited

U.S. PATENT DOCUMENTS 6,177,795 B1 * 1/2001 Zhu et al. .................. 324/307
6,819,108 B2 * 11/2004 Huang et al. ............... 324/320
7,479,783 B2 * 1/2009 Alsop ....................... 324/307

\* cited by examiner

*Primary Examiner*—Brij B Shrivastav
(74) *Attorney, Agent, or Firm*—Schiff Hardin LLP (57) ABSTRACT

A control device for a magnetic resonance system activates the coils of a transmission array and a gradient magnet system of the magnetic resonance system by causing an excitation pulse to be supplied to each coil. A magnetization that exhibits a first actual inhomogeneity thereby is generated in an excitation volume of the magnetic resonance system. The control device determines the excitation pulse for each coil using a start pulse and a maximum allowable inhomogeneity. The respective start pulse has a total time duration. When the control device activates the coils of the transmission array and of the gradient magnet system corresponding to the start pulse, a magnetization that exhibits a second actual inhomogeneity that is smaller than the maximum permissible inhomogeneity is generated in the excitation volume. The control device determines an intermediate point of the start pulse so that the respective start pulse is divided into a first pulse part and a second pulse part that is complementary to the first pulse part. The first pulse part corresponds to a respective low-energy portion of the start pulse, the second pulse part with a high-energy portion of the respective start pulse. The control device temporally extends the second pulse part and correspondingly compresses the second pulse part in terms of amplitude. The temporally extended and amplitude-compressed pulse part is used as the excitation pulse. The control device determines the intermediate point such that the first inhomogeneity is still smaller than the maximum allowable inhomogeneity.

16 Claims, 5 Drawing Sheets

FIG 12

CONTROL METHOD FOR SAR-OPTIMIZED ACTIVATION OF A COIL ARRAY

BACKGROUND OF THE INVENTION

1. Field of the Invention

The present invention concerns a control method for coils of a transmission array and a gradient magnet system of a magnetic resonance system of the type wherein a control device of the magnetic resonance system activates the coils of the transmission array and the gradient magnet system corresponding to a respective excitation pulse, and wherein a magnetization that exhibits a first actual inhomogeneity is generated in an excitation volume of the magnetic resonance system due to the activation of the coils of the transmission array and the gradient magnet system corresponding to the respective excitation pulse.

The present invention furthermore concerns a computer readable medium encoded with machine code (programming instructions) that can be directly executed by a control device of a magnetic resonance examination system, with the execution by the control device causing such a device executes such a control method. The present invention also concerns a data medium with such a computer program stored on the data medium.

The present invention also concerns a magnetic resonance system of the type having a basic field magnet, a gradient magnet system, a transmission array with a number of transmission coils and a control device, wherein the transmission coils can be activated by the control device so that a magnetization is generated in an excitation volume of the magnetic resonance system by means of the transmission coils.

2. Description of the Prior Art

In magnetic resonance systems with basic field strengths greater than approximately 3 T, significant eddy currents are induced in the patient body. As a result, the actual homogeneous magnetic field distribution of the whole-body coil alone becomes more or less inhomogeneous within the patient. In isolated cases, this inhomogeneity can lead to the situation that a reliable imaging in specific body regions is problematic.

In conventional magnetic resonance systems, the achievable field distribution is permanently predetermined by the activation of the antenna.

The desired homogeneous magnetization (=deflection of the spins) can ensue via what are known as 2D or 3D excitation pulses in which radio-frequency and gradient pulse forms are simultaneously modulated. The modulation must be re-determined for every patient from the knowledge of the radio-frequency field distribution. This method is used in practice, but very long transmission pulses (for example longer than 10 ms) result.

Analogous to the use of multi-channel systems upon reception, the use of multi-channel systems can result in an undersampling of frequency space in the transmission mode. The missing information can in this case be acquired from the different field profiles of the coils. The procedure is known to those skilled in the art under the designation "TX-SENSE".

The known 2D or 3D excitation pulses can be "accelerated". The duration of the excitation pulses is thereby reduced to 1 ms to 4 ms, for example, such that they exhibit lengths that are usable for imaging. A problem with such excitation pulses is in that the SAR (=specific absorption rate) and the transmission power requirements are many times higher (factors of approximately 20 to 30 are typical) in comparison to conventional single-channel transmission systems, even for the unaccelerated TX-SENSE pulses, and moreover the SAR and the power requirement for such pulses increase approximately quadratically with the acceleration.

Approaches by means of which the SAR can be reduced are known from scientific papers (that are published in ISMRM 2007, Page 673 and Page 674, for example). However, the SAR still lies well above the SAR of the single-channel solution.

These factors are also discussed, for example, in "An Image Domain Approach for the Design of RF Pulses in Transmit SENSE" by W. A. Grissom et al., Proceedings International Society of Magnetic Resonance in Medicine 13 (2005), page 19; "Parallel Excitation with an Array of Transmit Coils" by Yudong Zho, published in Magnetic Resonance in Medicine, Volume 51 (2004), Pages 775 through 784; and "Parallel Excitation: Making SENSE of High-Field Body MRI", by Yudong Zhu; and United States Patent Application Publication No. 2005/134267.

SUMMARY OF THE INVENTION

An object of the present invention is to provide a control method for coils of a transmission array of a magnetic resonance system as well as a corresponding computer-readable medium, control device and magnetic resonance system by means of which the SAR can be significantly reduced, and nevertheless a good image quality can be achieved.

In the embodiment of the invention, in the form of a control device, the above object is achieved by a control device that determines the respective excitation pulse using a start pulse and a maximum allowable inhomogeneity in the excitation volume of the magnetic resonance system. The start pulse has a total time duration. When the control device activates the coils of the transmission array and of the gradient magnet system corresponding to the respective start pulse, a magnetization that exhibits a second actual inhomogeneity, that is smaller than the maximum permissible inhomogeneity, is generated in the excitation volume of the magnetic resonance system. The control device determines an intermediate point of the start pulse so that the start pulse is divided into a first pulse part and a second pulse part that is complementary to the first pulse part. The first pulse part corresponds with a low-energy portion of the start pulse; the second pulse part corresponds with a high-energy portion of the start pulse. The control device temporally extends the second pulse part and correspondingly compresses the second pulse part in terms of amplitude. The temporally extended and amplitude-compressed second pulse part corresponds with the excitation pulse. The control device determines the intermediate point such that the first inhomogeneity is still smaller than the maximum allowable inhomogeneity.

The above object also is achieved in accordance with the present invention by a computer-readable medium encoded with programming instructions that, when loaded into a control computer of a magnetic resonance imaging apparatus, cause the control computer to implement a method as described above.

The above object also is achieved in accordance with the present invention by a computerized controller for a magnetic resonance imaging system that is programmed to operate the magnetic resonance imaging system in accordance with the method described above.

In the control device such a computer program is stored in its memory. The magnetic resonance system has such a control device.

It is possible to temporally extend the second pulse part and to correspondingly uniformly compress it in terms of its amplitude, but it is preferable that the control device does not linearly temporally extend the second pulse part. The SAR can thereby be additionally reduced. In particular, it is advantageous for the control device to locally temporally extend the second pulse part more strongly the more energy-rich that the respective second pulse part is locally. The SAR can be very strongly reduced by this procedure.

The dimension of the temporal extension can be determined as needed. It is preferred for the control device to extend the respective second pulse part to the total time duration.

For example, the entirety of the start pulses can correspond in frequency space with a two- or three-dimensional spiral trajectory. It is preferable that the spiral trajectory runs inwardly from the outside in frequency space.

The first pulse part of the start pulse normally lies temporally before the second pulse part of the start pulse, but in exceptional cases the reverse can apply.

The maximum allowable inhomogeneity may be permanently predetermined, but preferably the control device will predetermine this value.

The maximum allowable inhomogeneity can be greater than 5%. In particular, it can lie between 5% and 10%.

The second actual inhomogeneity advantageously lies below 0.5%, in particular at approximately 0.25%.

A ratio of maximum allowable inhomogeneity and second actual inhomogeneity can be relatively large. In particular, it can be greater than 10:1.

DESCRIPTION OF THE PREFERRED EMBODIMENTS

Figure 1:
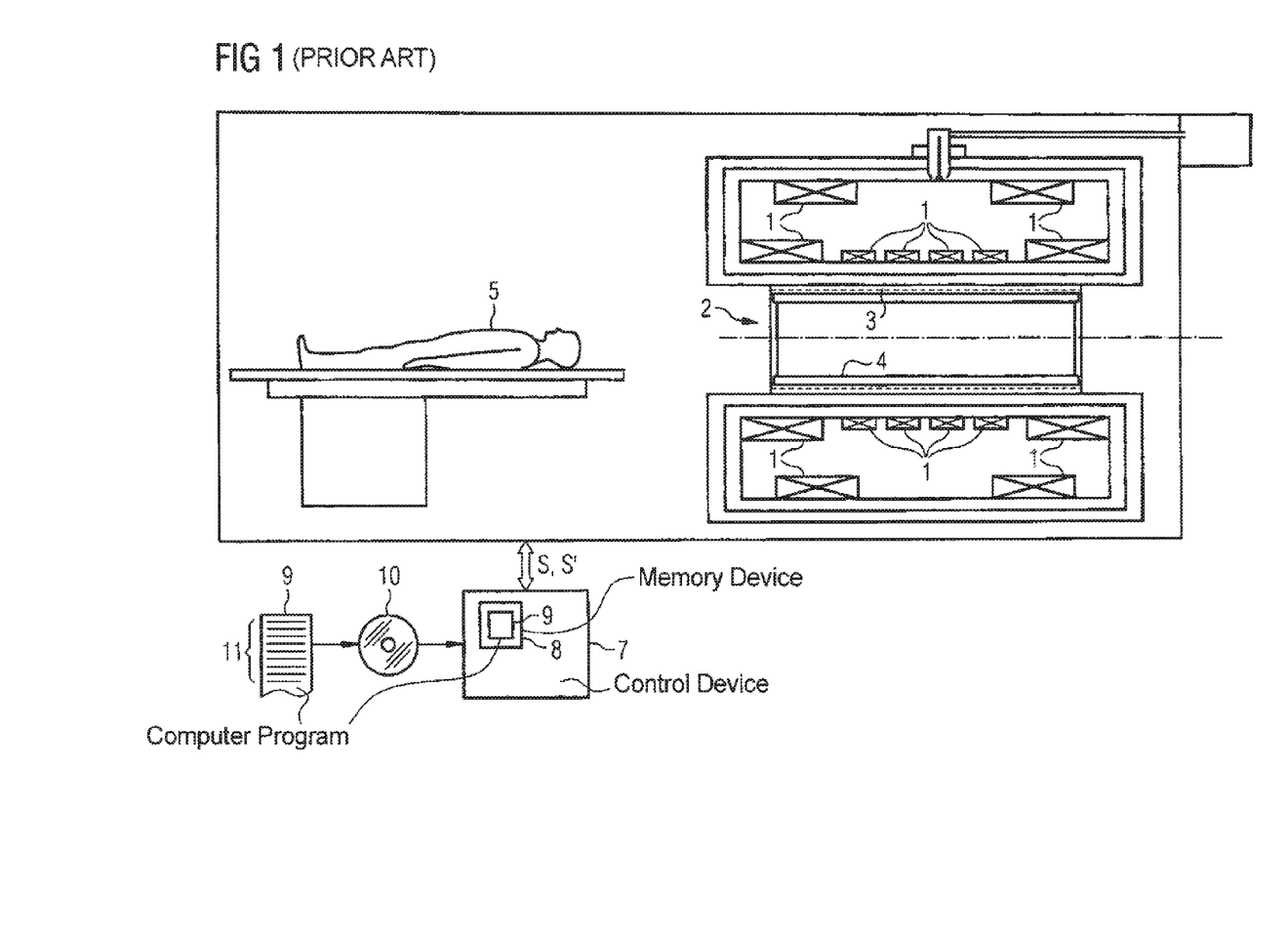
FIG. 1 schematically illustrates the basic design of a magnetic resonance system.

According to FIG. 1, a magnetic resonance system has a basic field magnet 1. A temporally static, locally homogeneous basic magnetic field is generated in an excitation volume 2 by means of the basic field magnet 1.

The magnetic resonance system furthermore has a gradient magnet system 3. Gradient magnetic fields can be generated in three axial directions of a Cartesian coordinate system in the excitation volume 2 by means of the gradient magnet system 3.

The magnetic resonance system also has a radio-frequency system 4. The excitation volume 2 can be charged with a radio-frequency, locally essentially homogeneous excitation field (radio-frequency field) by means of the radio-frequency system 4 so that an examination subject 5 (often a person 5) arranged in the excitation volume 2 is excited to magnetic resonances.

Figure 2:
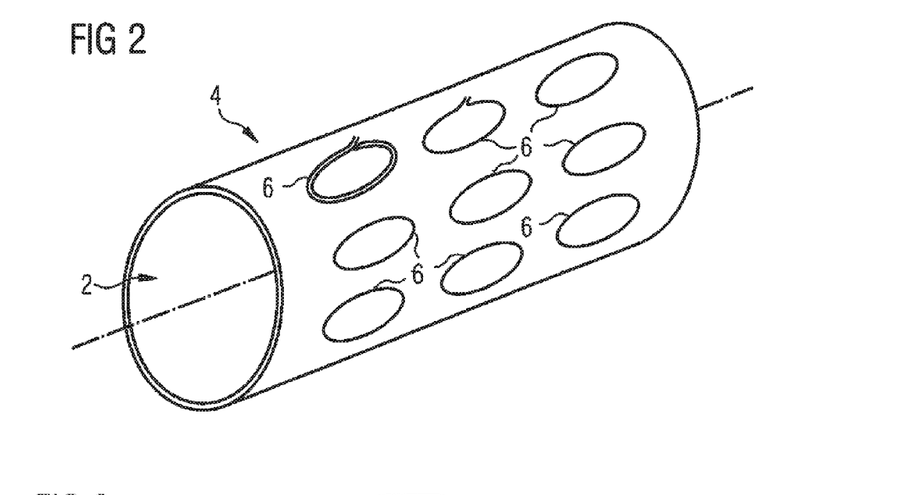
FIG. 2 schematically illustrates coils of a transmission array.

The radio-frequency system 4 can be fashioned as a whole-body coil, but in the center of the present invention the radio-frequency system 5 is fashioned as a transmission array that has a number of transmission coils 6. The transmission coils 6 can be controlled individually.

The magnetic resonance system also has a control device 7. The control device 7 controls the gradient magnet system 3 and the transmission coils 6 of the radio-frequency system 4.

The control device 7 is normally fashioned as a software-programmable controller. It therefore has a memory device 8 in which a computer program 9 is stored. The computer program 9 can already have been stored in the memory device 8 during the manufacture of the control device 7. Alternatively, it is possible to store the computer program 9 in the memory unit 8 via a computer connection (not shown in FIG. 1), for example a connection to the Internet. Another possibility is to store the computer program 9 on a data medium 10 and to connect the data medium 10 to the control device 7 via a corresponding interface so that the computer program 9 can be read from the data medium 10 and stored in the memory device 8. The data medium 10 is shown in FIG. 1 as a CD-ROM, solely as an example. The data medium 10 can be in other embodiments, for example as a USB memory stick or a memory card.

The computer program 9 is stored in the memory device 8 (and if applicable also on the data medium 10) in electronic, exclusively machine-readable form. It includes machine code 11 that can be executed directly by the control device 7. In operation of the control device 7, the computer program 9 is retrieved from the memory device 8 and executed by the control device 7. The execution of the computer program 9 by the control device 7 has the effect that the control device 7 executes a control method that is subsequently explained in detail in connection with FIG. 3. For this purpose, at least the transmission coils 6 are activated due to the execution of the control method by the control device 7. In many cases, the gradient magnet system 3 is additionally activated.

Figure 3:
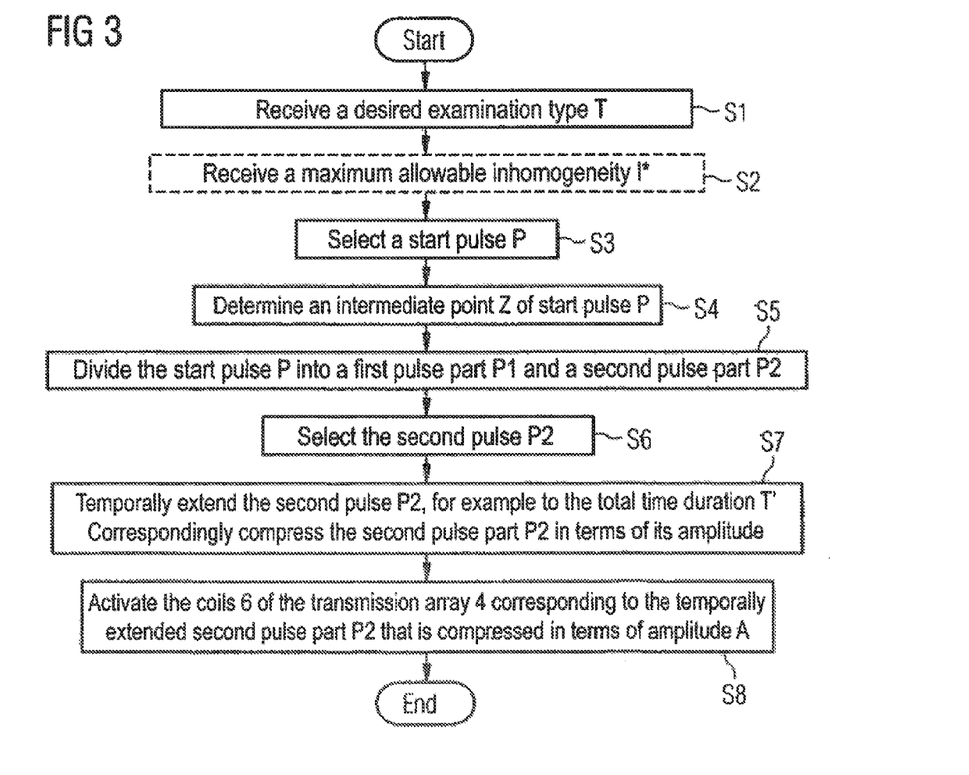
FIG. 3 is a flowchart of an embodiment of the inventive method.

According to FIG. 3, the control device 7 initially receives a desired examination type T in Step S1. In Step S2 the control device 7 then receives a maximum allowable inhomogeneity I*. The maximum allowable inhomogeneity I* is defined by the formula $$I^* = \frac{A\max - A\min}{A\min}. \quad (1)$$

Amax and Amin are respectively the maximum and minimum amplitude A of the magnetization within the excitation volume 2 that may occur at an arbitrary point in time upon charging of the excitation volume 2 with an excitation pulse P' after the entire pulse duration P'. Alternatively, the maximum allowable inhomogeneity I* can be defined in an equivalent manner, for example via the standard deviation of the magnetization divided by the average value of the magnetization.

Step 2 is optional and is therefore shown only with dashed lines in FIG. 3. As an alternative to the explicit specification of the maximum allowable inhomogeneity I*, the maximum allowable inhomogeneity I* can be permanently predetermined for the control device 7 or can be automatically determined by the control device 7 based on other boundary conditions (in particular the examination type T provided in Step S1). Independent of the type of determination of the maximum allowable inhomogeneity I*, the value of the maximum allowable inhomogeneity I* normally lies between 5% and 10%. It can in particular be greater than 5%.

In Step S3, the control device 7 respectively determines a start pulse P as well as a suitable activation for the gradient magnet system 3 for each of the transmission coils 6. The determination of the start pulses P and the activation ensues using the desired examination type T. The start pulses P together define amplitude and phase of the magnetization in space and time. FIG. 4 through 7 show

- the amplitude A of the start pulse P of one of the transmission coils 6 as a function of time t (FIG. 4),
- the curve of an x-gradient magnetic field and y-gradient magnetic field as a function of time t (FIGS. 5 and 6) as well as
- the gradient trajectory of the start pulses P in frequency space that thereby results.

The phase relation of the radio-frequency pulses P is not shown as well. It is likewise determined in Step S3. The corresponding procedure is generally known those of ordinary skill in the field of magnetic resonance imaging.

It can be seen from FIG. 4 through 7 that the entirety of the start pulses P in connection with the activation of the gradient magnet system 3 corresponds in frequency space with a two-dimensional or three-dimensional spiral trajectory. Due to the time curves of the gradient fields, the spiral trajectory hereby runs from the outside inward in frequency space. A total time duration T' of the start pulses P is in the millisecond range, for example 2.8 ms according to FIG. 4 through 6.

It would be possible to directly determine corresponding activation signals S, S' for the transmission coils 6 and the gradient magnet system 3 using the start pulses and the activation, such that the control device 7 activates the transmission coils 6 and the gradient magnet system 3 corresponding to the respective start pulse P. If this procedure were implemented, the magnetization generated in the excitation volume 2 would exhibit a relatively small actual inhomogeneity I1. This small actual inhomogeneity I1 would be smaller than the maximum allowable inhomogeneity I*. In particular, a ratio between the maximum allowable inhomogeneity I* and the small actual inhomogeneity I1 would normally be a value greater than 10:1. For example, the small actual inhomogeneity I1 can be below 0.5%, in particular at approximately 0.25%.

In accordance with the present invention, the activation signals S, S' are not determined using the start pulses P. Instead, in Step S4 the control device 7 determines an intermediate point Z of the respective start pulse P. The intermediate point Z is hereby uniform for all start pulses P. With this procedure it is possible for the control device 7 to divide the start pulse P into a first pulse part P1 and a second pulse part P2 in Step S5, namely into the first pulse part P1 temporally before the intermediate point Z and the second pulse part P2 temporally after the intermediate point Z. According to FIG. 4 through 7, the intermediate point Z lies at the value 2.5 ms. This position is only an example. An analogous procedure is taken for the activation of the gradient magnet system 3.

Figure 4:
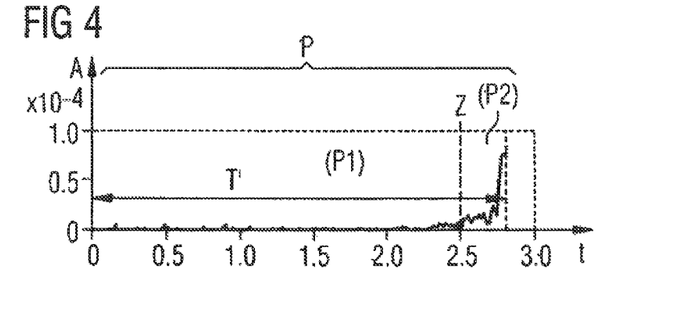
FIG. 4 shows an exemplary amplitude curve of a start pulse for a coil of a transmission array.
Figure 5:
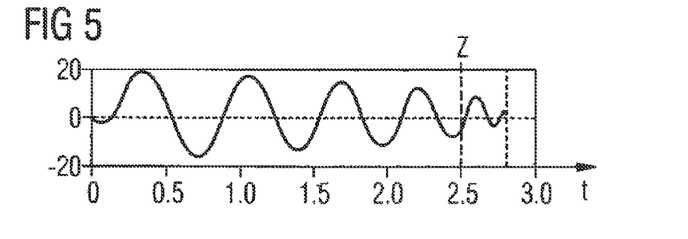
FIGS. 5 through 7 are various representations of the activation signals of gradient coils for interaction with the start pulse from FIG. 4.
Figure 6:
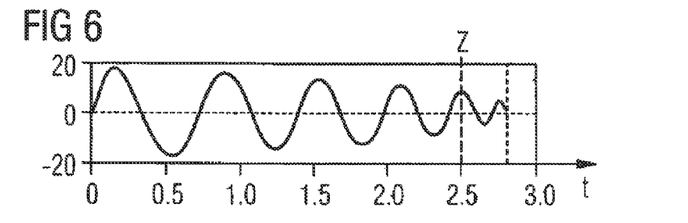
Figure 7:
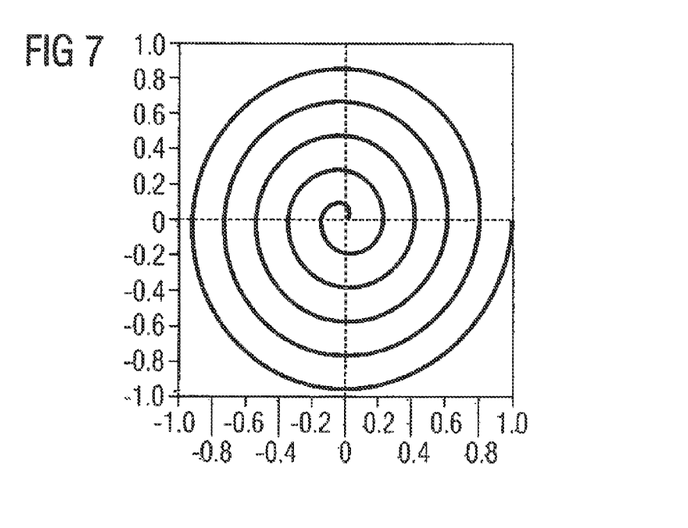
Figure 8:
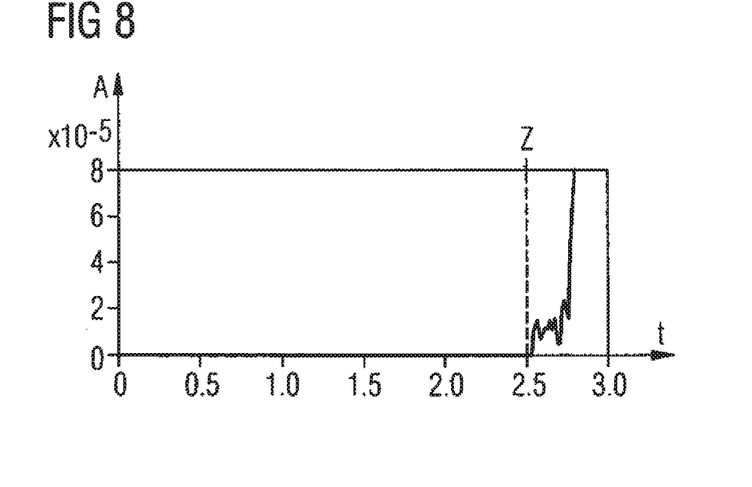
FIG. 8 shows an exemplary amplitude curve of a second pulse part for the same coil as in FIG. 4.
Figure 9:
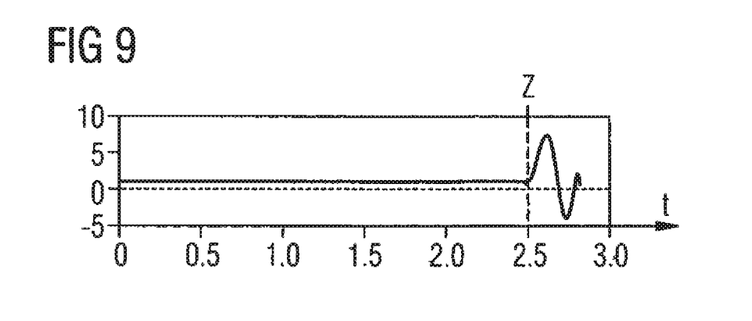
FIGS. 9 through 11 are various representations of the activation signals of gradient coils for interaction with the second pulse part from FIG. 8.
Figure 10:
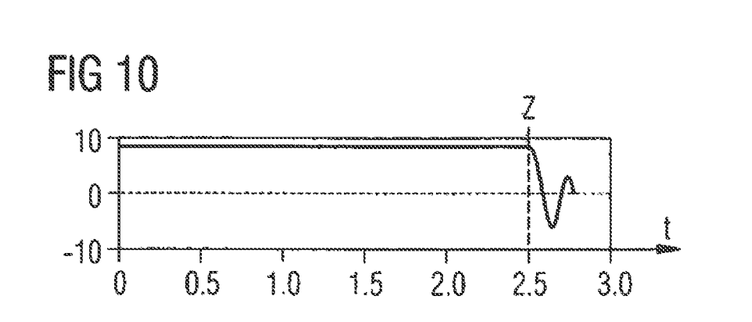
Figure 11:
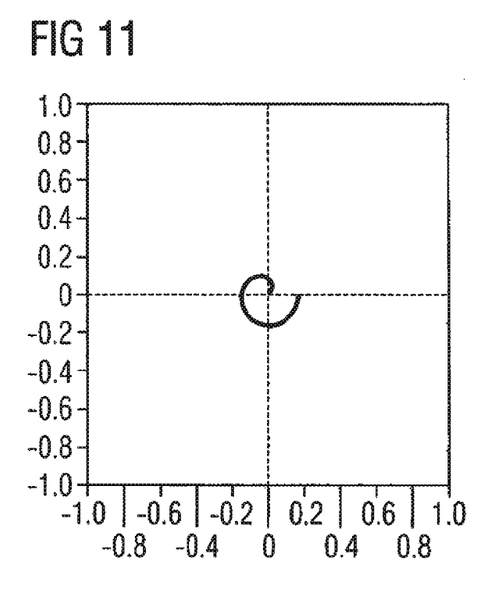

From FIG. 4 it is shown that the first pulse part P1 corresponds with a low-energy portion of the start pulse P, the second pulse part P2 with a high-energy portion of the start pulse P. Furthermore, it is shown that the first pulse part P1 of the respective start pulse P temporally lies before the second pulse part P2 of the respective start pulse P.

The first pulse part P1 is irrelevant in the framework of the procedure according to the invention. It is not used anymore in the following. Only the second pulse part P2 is used. In Step S6 the control device 7 therefore selects the second pulse part P2. In FIG. 8 through 11 the second pulse part P2 is represented in amplitude A of one of the transmission antennas 6 as well as x- and y-gradient as a function of time t, as well as in the gradient trajectory in frequency space, analogous to the entire start pulse P.

In Step S7, the control device 7 temporally extends the second pulse part P2. It correspondingly compresses the second pulse part P2 in terms of its amplitude A. The temporal extension and the corresponding compression in terms of amplitude A hereby ensue for all second pulse parts P2 based on a uniform time base and in a uniform manner. The activation of the gradient magnet system 3 is analogously temporally extended, but not compressed in terms of amplitude.

According to Step S7, a temporal extension ensues up to the total time duration T'. Although this is preferable, it is not absolutely necessary.

In Step S8, the control device 7 controls the transmission array 4 and the gradient magnet system 3 corresponding to the second pulse part P2 that is temporally extended and compressed in terms of amplitude A. The second pulse part P2 that is temporally extended and compressed in terms of amplitude A therefore corresponds with the respective excitation pulse P'. The activation of the transmission coils 6 by the control device 7 ensues individually for each transmission coil 6.

A real actual inhomogeneity I2 is achieved in the excitation volume 2 due to the activation of the coils 6 of the transmission array 4 and of the gradient magnet system 3 corresponding to the respective excitation pulse P'. The real actual inhomogeneity I2 is greater than the small actual inhomogeneity I1 mentioned in the preceding in connection with the start pulse P. Its value depends on the position of the intermediate point Z. The intermediate point Z is defined by the control device 7 such that the real actual inhomogeneity I2 is still smaller than the maximum allowable inhomogeneity I*.

In the procedure according to the invention, the control device 7 thus determines the excitation pulse P' using the start pulse P and the maximum allowable inhomogeneity I*.

In the simplest case, in Step S7 the control device 7 can produce a linear extension of the second pulse parts P2 in time t and a linear compression of the second pulse parts P2 that corresponds with this in terms of amplitude A. A temporal extension with an extension factor k and a compression by the factor k would thus be produced, whereby the factor k could be determined (according to the above numerical example) as $$k = \frac{2.8 \text{ ms}}{2.8 \text{ ms} - 2.5 \text{ ms}} = \frac{2.8}{0.3} \approx 9.33. \tag{2}$$

More preferably in Step S7, however, the control device 7 advantageously produces a non-linear extension of the respective second pulse part P2. The control device 7 can locally temporally extend the respective second pulse part P2 more, the more energy-rich that the respective second pulse part P2 is locally. It is noted that the term "local" refers to a specific point in time within the respective second pulse part P2. The amplitudes A' of the transmission coils 6 for emission of the excitation pulse P' result in this case using the relationship $$A'(t') = \frac{A'(t'(t))}{dt'/dt} \tag{3}$$

Figure 12:
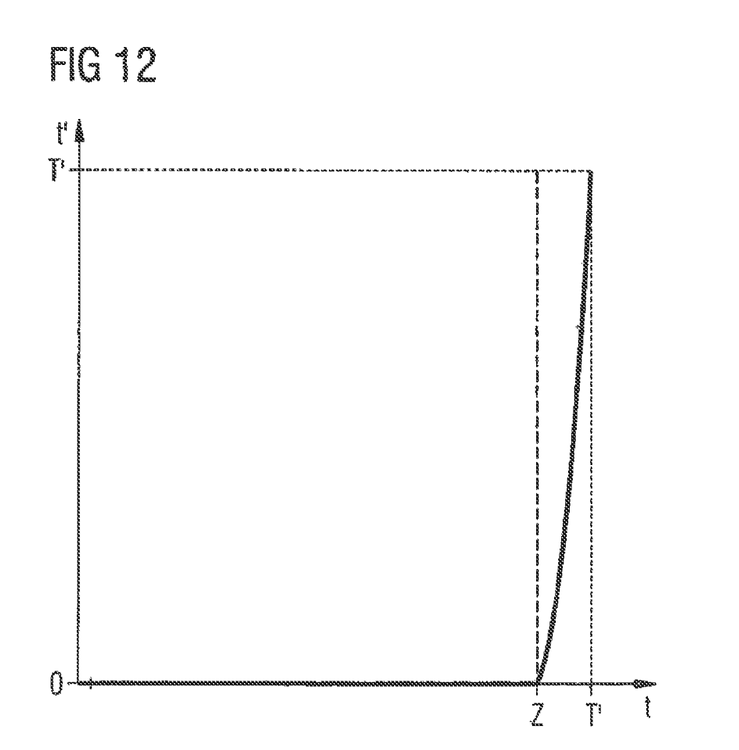
FIG. 12 is an example of a time transformation.

FIG. 12 shows a corresponding possible, non-linear transformation of the time.

A distinct improvement of the achievable magnetization homogeneity in comparison to conventional solutions results via the procedure according to the invention. Nevertheless, relatively short excitation pulses P' can be realized. The necessary peak transmission power and the SAR corresponding to this are thus reduced to the extent that the corresponding values approach the values achievable in conventional excitations given simultaneous homogeneous magnetization in the excitation volume 2.

Although modifications and changes may be suggested by those skilled in the art, it is the intention of the inventors to embody within the patent warranted hereon all changes and modifications as reasonably and properly come within the scope of their contribution to the art.

We claim as our invention:

1. A control method for operating coils of a transmission array and a gradient magnet system of a magnetic resonance system, said control method comprising the steps of:
   from a control device of the magnetic resonance system, activating the coils of the transmission array and the gradient magnet system by supplying an excitation pulse thereto that produces a magnetization in an excitation volume of the magnetic resonance system that exhibits a first actual inhomogeneity;
   in said control device, automatically determining said excitation pulse based on a start pulse and a maximum allowable inhomogeneity in the excitation volume of the magnetic resonance system, said start pulse having a total time duration;
   in said control device, giving said start pulse a total time duration that will produce a magnetization in said excitation volume that exhibits a second actual inhomogeneity that is smaller than said maximum allowable inhomogeneity;
   in said control device, automatically determining an intermediate point within the duration of the start pulse so as to divide the start pulse into a first pulse part and a second pulse part that is complementary to said first pulse part, with said first pulse part corresponding to a low-energy portion of said start pulse and said second pulse part corresponding to a high-energy portion of said start pulse;
   in said control device, temporally extending the second pulse part and correspondingly compressing the second pulse part in terms of amplitude, to produce a temporally extended and amplitude-compressed second pulse part;
   employing said temporally extended and amplitude-compressed second pulse part as said excitation pulse; and
   in said control device, determining said intermediate point to make said first inhomogeneity smaller than said maximum allowable inhomogeneity.

2. A control method as claimed in claim 1 comprising, in said control device, extending said second pulse part non-linearly.

3. A control method as claimed in claim 2 comprising, in said control device, locally temporally extending said second pulse part more strongly the more energy-rich said second pulse part is locally.

4. A control method as claimed in claim 1 comprising, in said control device, extending the second pulse part to equal said total time duration.

5. A control method as claimed in claim 1 comprising, in said control device, designing said start pulse to have a trajectory in frequency space selected from the group consisting of a two-dimensional spiral trajectory and a three-dimensional spiral trajectory.

6. A control method as claimed in claim 5 comprising designing said start pulse to have said trajectory in frequency space that proceeds inwardly from a periphery of frequency space.

7. A control method as claimed in claim 1 comprising, in said control device, dividing said start pulse to make said first pulse part lie temporally before said second pulse part.

8. A control method as claimed in claim 1 comprising providing said maximum allowable inhomogeneity to said control device from an external source.

9. A control method as claimed in claim 1 comprising employing a value for said maximum allowable inhomogeneity that is great than 5%.

10. A control method as claimed in claim 1 comprising employing a value for said maximum allowable inhomogeneity in a range between 5% and 10%.

11. A control method as claimed in claim 1 comprising employing a value for said second actual inhomogeneity that is below 0.5%.

12. A control method as claimed in claim 1 comprising employing a value for said second actual inhomogeneity that is approximately 0.25%.

13. A control method as claimed in claim 1 comprising, in said control device, setting said second actual inhomogeneity so that a ratio of said maximum allowable inhomogeneity to said second actual inhomogeneity is greater than 10:1.

14. A non-transitory computer readable medium encoded with programming instructions, said computer-readable medium being loadable into a computerized controller of a magnetic resonance system comprising a transmission array and a gradient magnet system, said programming instructions causing said computerized controller to operate said magnetic resonance system by:
   from a control device of the magnetic resonance system, activating the coils of the transmission array and the gradient magnet system by supplying an excitation pulse thereto that produces a magnetization in an excitation volume of the magnetic resonance system that exhibits a first actual inhomogeneity;
   in said control device, automatically determining said excitation pulse based on a start pulse and a maximum allowable inhomogeneity in the excitation volume of the magnetic resonance system, said start pulse having a total time duration;
   in said control device, giving said start pulse a total time duration that will produce a magnetization in said excitation volume that exhibits a second actual inhomogeneity that is smaller than said maximum allowable inhomogeneity;
   in said control device, automatically determining an intermediate point within the duration of the start pulse so as to divide the start pulse into a first pulse part and a second pulse part that is complementary to said first pulse part, with said first pulse part corresponding to a low-energy portion of said start pulse and said second pulse part corresponding to a high-energy portion of said start pulse;
   in said control device, temporally extending the second pulse part and correspondingly compressing the second pulse part in terms of amplitude, to produce a temporally extended and amplitude-compressed second pulse part;
   employing said temporally extended and amplitude-compressed second pulse part as said excitation pulse; and
   in said control device, determining said intermediate point to make said first inhomogeneity smaller than said maximum allowable inhomogeneity.

15. A computer controller for a magnetic resonance system, said magnetic resonance system comprising a transmission array and a gradient magnet system, said computerized controller being programmed to operate said magnetic resonance system by:

from a control device of the magnetic resonance system, activating the coils of the transmission array and the gradient magnet system by supplying an excitation pulse thereto that produces a magnetization in an excitation volume of the magnetic resonance system that exhibits a first actual inhomogeneity;

in said control device, automatically determining said excitation pulse based on a start pulse and a maximum allowable inhomogeneity in the excitation volume of the magnetic resonance system, said start pulse having a total time duration;

in said control device, giving said start pulse a total time duration that will produce a magnetization in said excitation volume that exhibits a second actual inhomogeneity that is smaller than said maximum allowable inhomogeneity;

in said control device, automatically determining an intermediate point within the duration of the start pulse so as to divide the start pulse into a first pulse part and a second pulse part that is complementary to said first pulse part, with said first pulse part corresponding to a low-energy portion of said start pulse and said second pulse part corresponding to a high-energy portion of said start pulse;

in said control device, temporally extending the second pulse part and correspondingly compressing the second pulse part in terms of amplitude, to produce a temporally extended and amplitude-compressed second pulse part;

employing said temporally extended and amplitude-compressed second pulse part as said excitation pulse; and in said control device, determining said intermediate point to make said first inhomogeneity smaller than said maximum allowable inhomogeneity.

16. A magnetic resonance system comprising:

a basic field magnet that generates a basic magnetic field in an examination volume;

a radio-frequency transmission array comprising a plurality of coils;

a gradient magnet system; and a computerized control device configured to activate the coils of the transmission array and the gradient magnet system by supplying an excitation pulse thereto that produces a magnetization in an excitation volume of the magnetic resonance system that exhibits a first actual inhomogeneity, and to determine said excitation pulse based on a start pulse and a maximum allowable inhomogeneity in the excitation volume of the magnetic resonance system, said start pulse having a total time duration, and to give said start pulse a total time duration that will produce a magnetization in said excitation volume that exhibits a second actual inhomogeneity that is smaller than said maximum allowable inhomogeneity, and to automatically determine an intermediate point within the duration of the start pulse so as to divide the start pulse into a first pulse part and a second pulse part that is complementary to said first pulse part, with said first pulse part corresponding to a low-energy portion of said start pulse and said second pulse part corresponding to a high-energy portion of said start pulse, and to temporally extend the second pulse part and correspondingly compress the second pulse part in terms of amplitude, to produce a temporally extended and amplitude-compressed second pulse part, and to employ said temporally extended and amplitude-compressed second pulse part as said excitation pulse, and to determine said intermediate point to make said first inhomogeneity smaller than said maximum allowable inhomogeneity.

\* \* \* \* \*